United States Patent

Naulleau

[11] Patent Number: 6,151,115
[45] Date of Patent: Nov. 21, 2000

[54] PHASE-SHIFTING POINT DIFFRACTION INTERFEROMETER FOCUS-AID ENHANCED MASK

[76] Inventor: Patrick Naulleau, 5239 Miles Ave., Apt. A, Oakland, Calif. 94618

[21] Appl. No.: 09/361,780
[22] Filed: Jul. 26, 1999
[51] Int. Cl.[7] ........................................... G01B 9/02
[52] U.S. Cl. .................................. 356/354; 356/359
[58] Field of Search .............................. 356/354, 359; 250/201.2

[56] References Cited

U.S. PATENT DOCUMENTS 5,835,217  11/1998  Medecki.

OTHER PUBLICATIONS

Naulleau, Patrick, et al. "Characterization of the accuracy of EUV phase–shifting point diffraction interferometry", *SPIE*, V. 3331 (1998) 114–123.

Anderson, Erik H., et al., "Electron beam lithography digital pattern generator and electronics for generalized curvilinear structures", *J. Vac. Sci. Technol.B*, vol. 13, No. 6, (1995) 2529–2534.

Brophy, Chris P., "Effect of intensity error correlation on the computed phase of phase–shifting interferometry", *J. Opt. Soc. Am. A*, vol. 7, No. 4 (1990) 537–541.

Medecki, H., et al., "Phase–shifting point diffraction interferometer" *Optics Letters*, vol. 21, No. 19 (1996) 1526–1528.

*Primary Examiner*—Robert H. Kim
*Assistant Examiner*—Phil Natividad
*Attorney, Agent, or Firm*—Burns, Doane, Swecker & Mathis, L.L.P.

[57] ABSTRACT

A phase-shifting point diffraction interferometer system (PS/PDI) employing a PS/PDI mask that includes a PDI focus aid is provided. The PDI focus aid mask includes a large or secondary reference pinhole that is slightly displaced from the true or primary reference pinhole. The secondary pinhole provides a larger capture tolerance for interferometrically performing fine focus. With the focus-aid enhanced mask, conventional methods such as the knife-edge test can be used to perform an initial (or rough) focus and the secondary (large) pinhole is used to perform interferometric fine focus. Once the system is well focused, high accuracy interferometry can be performed using the primary (small) pinhole.

30 Claims, 3 Drawing Sheets

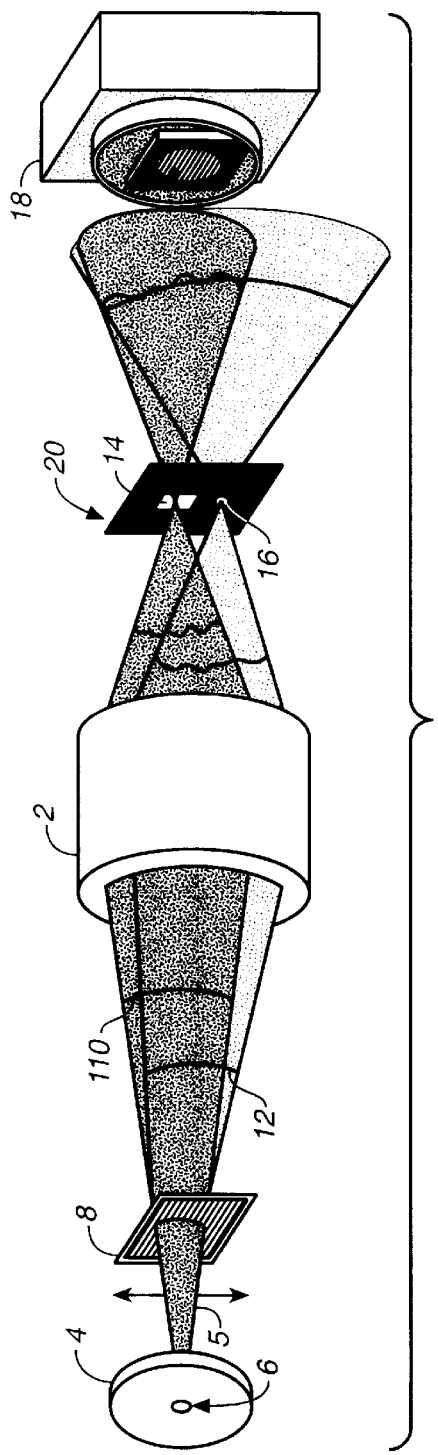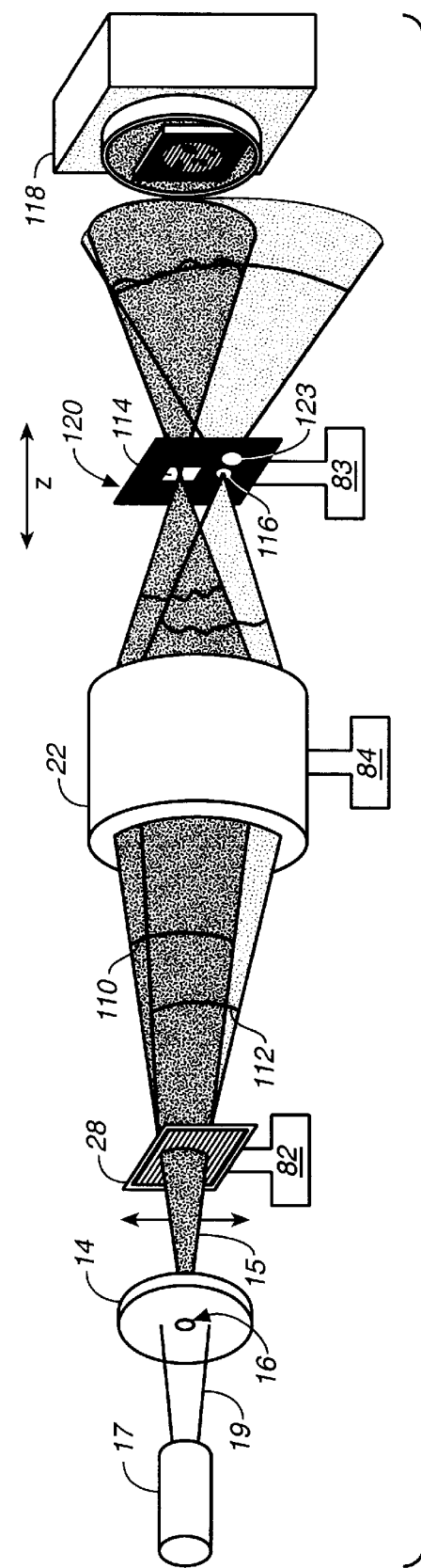

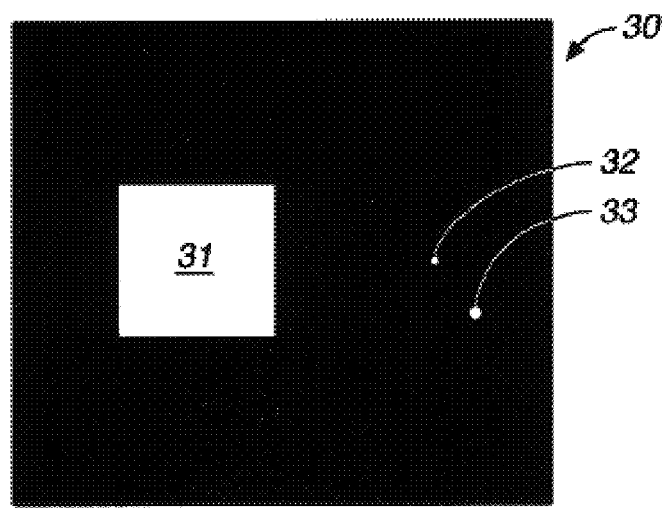
FIG._3
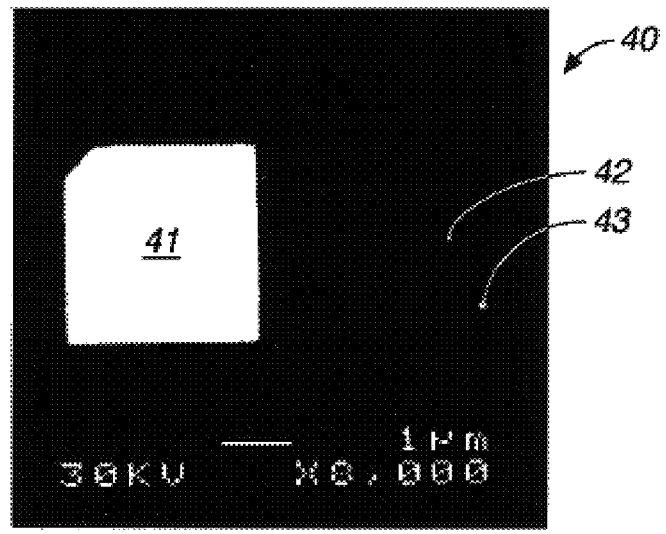
FIG._4

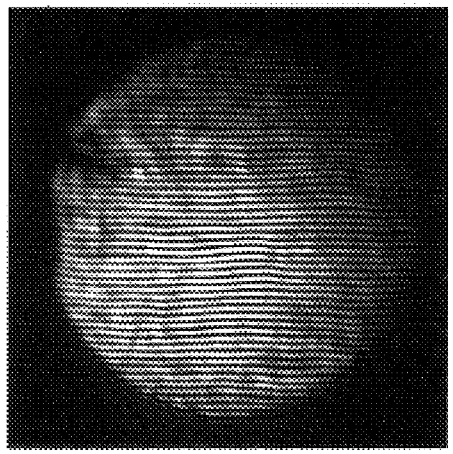
FIG._5A
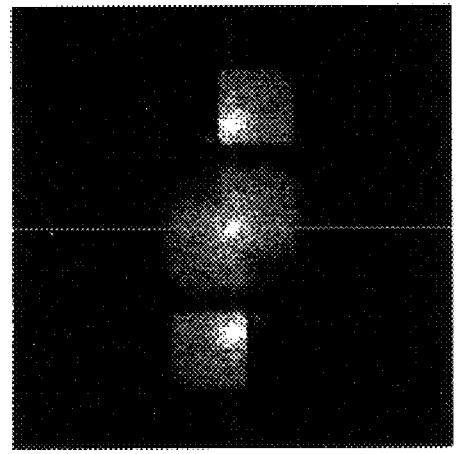
FIG._5B
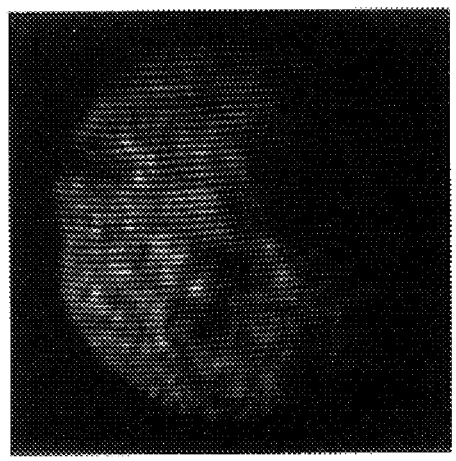
FIG._6
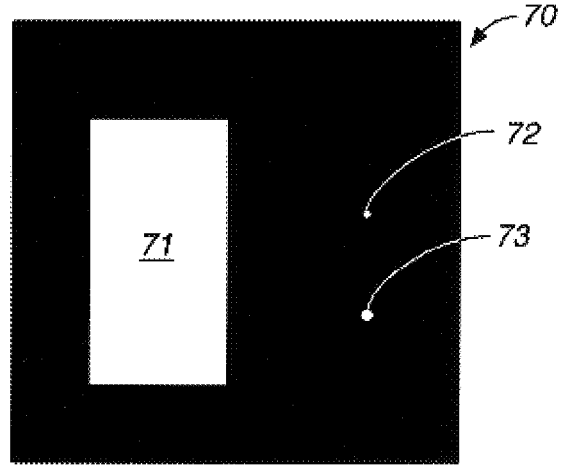
FIG._7

PHASE-SHIFTING POINT DIFFRACTION INTERFEROMETER FOCUS-AID ENHANCED MASK

The U.S. Government has certain rights in this invention pursuant to Contract No. DE-AC03-76SF00098 between the United States Department of Energy and the University of California for the operation of the Lawrence Berkeley National Laboratory.

BACKGROUND OF THE INVENTION

1. Field of the Invention

The present invention relates to interferometers for making highly accurate measurements of wavefront aberrations and particularly to phase-shifting point diffraction interferometers and methods for focusing them.

2. State of the Art

Optical metrology is the characterization of surfaces and materials using optical methods. An area of optical metrology relevant to the present invention is the use of an interferometer to measure the quality of a test optic, such as a single or multiple element mirror or lens system.

One important recent application of optical metrology is the testing of projection optics for photolithography systems. Modern photolithography systems used to fabricate integrated circuits must continually image smaller features. In pursuit of this goal, systems are confronted with the diffraction limit determined in part by the wavelength of the light employed. To meet the challenge of imaging ever smaller features, photolithographic systems must employ successively shorter wavelengths. Over the history of integrated circuit fabrication technology, photolithography systems have moved from visible to ultraviolet and may eventually move to even shorter wavelengths such as extreme ultraviolet or to yet shorter X-ray radiation.

For the extreme case of X-ray lithography, a proximity method that does not require re-imaging optics is under development. In X-ray proximity lithography, feature sizes are considerably larger than the wavelength limit. However, reticles in this case are required to have feature sizes equal to the desired printed feature size, currently on the order of 0.1 microns and smaller. It is quite difficult and expensive to manufacture reticles having such small feature sizes. Additionally, radiation passing through the reticle's narrow slits and apertures still diverges despite the extremely short wavelength. Thus, the reticles must be placed very close to the wafer, sometimes as close as a few microns, so that the shadow-cast image of the reticle remains sharp on the wafer. These systems must be carefully designed such that the reticle never contacts the wafer, an event that could destroy the reticle.

Because of the difficulties posed by proximity imaging a reticle pattern onto a wafer, it is desirable to extend the concepts of projection optics as currently used in visible-light or deep-ultraviolet lithography systems to even shorter wavelengths such as extreme ultraviolet. Such systems employ lenses or other optical elements to project a demagnified image of the reticle onto the wafer surface. This allows reticles to retain larger feature sizes, thus reducing the expense of generating the reticle itself.

As with all optical imaging systems, various aberrations such as spherical aberration, astigmatism, and coma may be present. These aberrations must be identified and removed during the fabrication and/or alignment of the projection optics, or the projection optics would introduce substantial blurring in the image projected onto the wafer.

In order to test the projection optics for various aberrations, interferometers may be employed. Conventional interferometers, based upon the Michelson design for example, employ a single coherent light source (at an object plane) which is split into a test wave and a reference wave. The test wave passes through the optic under test and the reference wave avoids that optic. The test and reference waves are recombined to generate an interference pattern or interferogram. Analysis of the interferogram, and the resultant wavefront with, for example, Zernike polynomials, indicates the presence of aberrations.

The reference wave of the interferometer should be "perfect"; that is, it should be simple and well characterized, such as a plane or spherical wave. Unfortunately, beam splitters and other optical elements through which the reference-beam passes introduce some deviations from perfection. Thus, the interferogram never solely represents the condition of the test optic. It always contains some artifacts from the optical elements through which the reference wave passes. While these artifacts, in theory, can be separated from the interferogram, it is usually impossible to know that a subtraction produces a truly clean interferogram.

To address this problem, "point diffraction interferometers" have been developed. An example of a point diffraction interferometer is the phase-shifting point diffraction interferometer (PS/PDI) described in H. Medecki, et al., "Phase-Shifting Point Diffraction Interferometer", *Optics Letters*, 21(19), 1526–28 (1996), E. Tejnil, et al., "At-Wavelength Interferometry for EUV Lithography", *J. Vacuum Science & Tech. B*, 15, 2455–2461 (1997), K. A. Goldberg, et al., "Characterization of an EUV Schwarzchild Objective Using Phase-Shifting Point Diffraction Interferometry", *Proceeding SPIE*, 3048, 264–270 (1997), E. Tejnil, et al., "Phase-Shifting Point Diffraction Interferometry for At-Wavelength Testing of Lithographic Optics", *OSA Trends in Optics and Photonics: Extreme Ultraviolet Lithography, Optical Society of America, Washington, D.C.*, 4, 118–123 (1996), K. A. Goldberg, "Extreme Ultraviolet Interferometry", doctoral dissertation, Dept. of Physics, Univ. of California, Berkeley (1997), and in the U.S. Pat. No. 5,835,217 "Phase-Shifting Point Diffraction Interferometer", Inventor Hector Medecki, which are all incorporated herein by reference.

The PS/PDI is a variation of the conventional point diffraction interferometer in which a transmission grating has been added to greatly improve the optical throughput of the system and add phase-shifting capability. In the PS/PDI, as illustrated in FIG. 1, the optical system 2 under test is illuminated by a spherical wave 5 that is generated by an entrance pinhole 6 in a mask 4 that is placed in the object plane of the optical system 2. To assure the quality of the spherical wave illumination, pinhole 6 is chosen to be several times smaller than the resolution limit of the optical system. Grating 8 splits the illuminating beam 5 to create the required test and reference-beams 10 and 12, respectively. A PS/PDI mask 20 is placed in the image plane of the optical system 2 to block the unwanted diffracted orders generated by the grating 8 and to spatially filter the reference-beam 12 using a reference pinhole 16. The test-beam 10, which contains the aberrations imparted by the optical system, is largely undisturbed by the image plane mask by virtue of it passing through a window 14 in the PS/PDI mask 20 that is large relative to the point spread function of the optical system. The test and reference-beams propagate to the mixing plane where they overlap to create an interference pattern recorded on a CCD detector 18. The recorded interferogram yields information on the deviation of the test-beam from the reference-beam which in the ideal case is a spherical wave.

As is apparent, the accuracy of the PS/PDI measurement system comes from the pinhole-diffraction-generated reference and illumination beams. The smaller the pinhole, the more spherical the reference wave becomes and the more accurate the measurement is. In, practice, when high accuracy is required, the reference pinhole should be significantly smaller than the diffraction-limited resolution of the optics under test. This condition makes focusing the PS/PDI crucial; when the reference-beam is not properly focused onto the pinhole an inordinate amount of reference light is lost and the measurement becomes impractical due to exceedingly low fringe contrast.

Currently, the PS/PDI focus procedure involves performing a knife-edge test on the PS/PDI window adjacent to the reference pinhole. In this technique, the window edge serving as the knife-edge is scanned across the focus of the optic under test. The intensity of radiation passing through the window is monitored. A transition region is observed between maximum intensity (when the beam passes completely through the window) and minimum intensity (when the beam is completely blocked by the mask). This "rough" focus is typically good enough to allow the subsequent interferometry to be performed for the "fine" focus implemented with the focus term from the interferogram. This method is effective down to pinhole sizes approximately equal to the diffraction-limited resolution but becomes unreliable with smaller pinholes due to the inability of the rough focus to bring the system into good enough focus to perform the initial interferometry. Thus the knife-edge method is not well suited for high-accuracy operation.

SUMMARY OF THE PRESENT INVENTION

The present invention is based in part in the recognition that the PS/PDI mask design can be modified to include a PDI focus aid in order to overcome the problem associated with small reference pinholes. The PDI focus aid is a large or secondary reference pinhole that is slightly displaced from the true or primary reference pinhole. The secondary pinhole provides a larger capture tolerance for interferometrically performing fine focus.

With the focus-aid enhanced mask, conventional methods such as the knife-edge test can be used to perform an initial (or rough) focus and the secondary (large) pinhole is used to perform interferometric fine focus. Once the system is well focused, high accuracy interferometry can be performed using the primary (small) pinhole.

Accordingly, in one embodiment, the invention is directed to a method of focusing a phase-shifting point diffraction interferometer that defines an optical path that includes (i) a source of electromagnetic energy in the optical path, (ii) an optical element under test in the optical path, and (iii) an irradiance detector in the optical path downstream from the optical element under test, wherein the method includes the steps of:

(a) positioning a mask in the image plane of the optical system under test positioned upstream of the irradiance detector wherein the mask defines a test-beam window and at least one reference pinhole and a focus-aid pinhole having a diameter of at least about 20% larger than that of the at least one reference pinhole;

(b) directing a beam focused by the optical element under test through the test-beam window;

(c) performing rough focus of the beam onto the image plane;

(d) positioning a beam divider in the optical path for dividing the electromagnetic radiation from the source into a test-beam and a reference-beam;

(e) aligning the mask so that the test-beam passes through the test-beam window and the reference-beam passes through the focus-aid pinhole;

(f) performing fine focus of the beams on the image plane by detecting interference patterns with the irradiance detector; and (g) maneuvering the mask so that the reference-beam passes through the reference-beam pinhole.

In another embodiment, the invention is directed to a point diffraction interferometer system that defines an optical path, said system including:

(a) a source of electromagnetic energy in the optical path;

(b) a beam divider that can be positioned in the optical path for dividing electromagnetic radiation from the source into a reference-beam and a test-beam;

(c) an irradiance detector in the optical path downstream from the source of electromagnetic energy;

(d) a mask that is positioned in the image plane of the optical system under test which is positioned upstream of the irradiance detector wherein the mask defines a test-beam window and at least one reference-beam pinhole and a focus-aid pinhole having a diameter of at least about 20% larger than that of the at least one reference pinhole;

(e) means for directing a beam focused by the optical system under test through the test-beam window;

(f) means for rough-focusing the beam onto the image plane;

(g) means for positioning the beam divider in the optical path for dividing the electromagnetic radiation from the source into a reference-beam and a test-beam;

(h) means for aligning the mask so that the test-beam passes through the test-beam window and the reference-beam passes through the focus-aid pinhole, (i) means for fine-focusing the test and reference-beams on the image plane by detecting interference patterns with the irradiance detector, and (j) means for maneuvering mask so that the reference-beam passes through the reference pinhole.

BRIEF DESCRIPTION OF THE DRAWING

The present invention may be further understood from the following description in conjunction with the appending drawing.

FIG. 1 is a schematic of a prior art phase-shifting point diffraction interferometer;

FIG. 2 is a schematic of a phase-shifting point diffraction interferometer with the focused-aid modified PS/PDI mask;

FIG. 3 illustrates a focused-aid modified PS/PDI mask design;

FIG. 4 is a SEM micrograph of the focused-aid-enhanced mask;

FIGS. 5A and 5B are a representative interferogram and its Fourier transform, respectively, developed from a through-focus test;

FIG. 6 is a focus-aid interferogram just beyond the capture range; and

FIG. 7 is another embodiment of the focus-aid mask.

DETAILED DESCRIPTION OF THE PREFERRED EMBODIMENT

A PS/PDI system implementing the inventive focusing scheme is illustrated in FIG. 2. The system includes a source of electromagnetic radiation 17 which directs a beam 19 onto an entrance pinhole 16 located in mask 14 that is placed in the object plane of the optical system 22. If the entrance pinhole is sufficiently small, the electromagnetic radiation 15 emitted through the entrance pinhole 16 is spatially coherent and essentially spherical. To this end, the entrance pinhole 16 is chosen to be several times smaller than the resolution limit of the optical system. The optical system 22 under test is illuminated by the essentially spherical wave 15. Beam divider 28, e.g., a transmission grating, splits the illuminating beam 15 to create the required test and reference-beams 110 and 112, respectively. A focus-aid modified mask 120 comprising test-beam window 114, reference-beam pinhole 116, and focus-aid pinhole 123 is placed in the image plane of the optical system 22. As is apparent, the relative sizes of the pinholes 116 and 123 are highly exaggerated.

The beam divider 28 and focus-aid mask 120 can be mounted on motor actuated stages 82 and 83, respectively, each having suitable rotational, translational, and longitudinal controls for precise maneuvers and alignments. The optical system can also be similarly mounted on stage 84. The preferred method for achieving rotational and separation alignment is by control of the beam divider. The beam divider can, for example, be mounted on a rotation stage with height control. In this case, the stage could be used to control the beam divider rotational orientation which would in turn control the image point rotational orientation and the stage could also control the separation between the beam divider and the entrance pinhole which would in turn control the image point separation. It is convenient for the stage to be controllable in situ. For certain applications such as extreme ultraviolet interferometry, where the system under test must be placed in vacuum, in situ control requires the stage motion to be in-vacuum motor actuated or manually actuated with vacuum feed-throughs.

As is apparent, positioning of the beam divider and the alignment/maneuvering of the mask can be accomplished in many ways aside from moving the beam divider or mask separately. For example, (i) moving the optic alone moves the image points relative to the mask, and (ii) moving the optic and image-plane mask as a unit moves the image points relative to the mask. In interferometers where the object-plane illumination is broad or movable, it is also possible to move the image points relative to the mask by moving the entrance pinhole. Precision stage assemblies are known in the art and are as described, for example, in U.S. Pat. Nos. 5,623,853 and 5,699,621 which are incorporated herein by reference.

Positioned downstream is an irradiance detector 118 used to record the interference pattern produced by the overlapping test and reference-beams. Examples of irradiance detectors include a camera with a photosensitive film, and a Vidicon camera; a preferred detector is a charged-couple device (CCD).

FIG. 3 depicts the novel focus-aid modified PS/PDI mask 30 comprising test-beam window 31, reference-beam pinhole 32, and focus-aid pinhole 33. The dimensions of the window, and two pinholes will depend on the wavelength of the electromagnetic energy employed. The focus-aid pinhole typically has a diameter that ranges from about 1.2 to 2.5 times the diffraction-limited resolution of the optical system under test. In the EUV to infrared (IR) regime, this is expected to correspond to diameters ranging from about 12 nm to 250 $\mu$m.

Typically the reference pinhole(s) each has a diameter that ranges from about 0.5 to 1 times the diffraction-limited resolution of the optical system under test. In the EUV to IR regime, this is expected to correspond to diameters ranging from 5 nm to 100 $\mu$m. Moreover, typically the reference pinhole(s) is separated from the focus-aid pinhole by a distance that ranges from about 10 to 100 times the diffraction-limited resolution of the optical system under test. Again, in the EUV to IR regime, this is expected to correspond to distances that range from 0.1 $\mu$m to 10 mm. Furthermore, typically the test-beam window defines an opening with a width in the direction of the image-plane beam separation that is 20 to 100 times the diffraction-limited resolution of the optical system under test (0.2 $\mu$m through 10 mm for the EUV to IR regime). The test-beam window width in the direction that is orthogonal to the direction of beam separation is typically equal to or preferably greater than the width in the direction of beam separation. Preferably, the window is square or rectangular-shaped and defines an opening with an area of about 0.04 $\mu$m$^2$ to 0.5 cm$^2$. The electromagnetic radiation employed typically has a wavelength of about 5 nm to 2 $\mu$m. For the EUV case, the reference and focus-aid pinholes are created by electron beam lithography and reactive ion etching. In one embodiment, the mask comprises a 200-nm thick Ni absorbing layer evaporated on a 100 nm $Si_3N_4$ membrane. The mask features are etched completely through the membrane prior to the Ni evaporation. Thus, the pinholes are completely open in the finished focus-aid modified PS/PDI mask, which maximizes their transmission.

PS/PDI systems may be configured many different ways. The source of electromagnetic radiation may be, for example, a laser or some other quasi-monochromatic source. If the source of radiation provides a spherical wave, the interferometer does not need to include the entrance pinhole through which radiation passes before it illuminates the test optic as described above.

The beam divider is preferably, though not necessarily, located between the source of electromagnetic radiation and the test optic region. Examples of suitable beam dividers include reflection type diffraction gratings, transmission type diffraction gratings, and polarization beamsplitters.

The novel focus-aid enhanced mask overcomes the focusing problems associated with employing reference-beam pinholes that are smaller than or equal to the diffraction-limited resolution of the optic under test. The focus-aid pinhole is a larger reference pinhole slightly displaced from the true reference pinhole. This larger pinhole provides more capture tolerance for interferometrically performing the fine focus.

Experimental

A PS/PDI system as illustrated in FIG. 2 was employed to demonstrate the effectiveness of the focus-aid mask. Specifically, the optical system used was a two mirror EUV system comprising a 10x-demagnification Schwarzchild objective with numerical aperture of 0.08 (image side) and measured system wavefront aberration magnitude on the order of 2 nm root-mean-squared (rms). Placed approximately 60 mm from the entrance pinhole on the 0.008 NA (object side) of the test optic is a square-wave transmission grating beam splitter with 18-micron pitch, producing approximately 50 fringes within the measurement numerical aperture. The electromagnetic radiation source which provided the coherent illumination was a synchrontron undulator beamline source (CXRO beamline 12.0.1.2 at the Advanced Light Source, Lawrence Berkeley National Laboratory) operating at a wavelength of 13.4 nm with a bandwidth $\lambda/\Delta\lambda$ of about 200. The detector is a back-thinned, back-illuminated EUV CCD detector positioned 132 mm downstream from the image-plane mask. This system is further described in K. A. Goldberg, et al., "Characterization of an EUV Schwarzchild Objective Using Phase-Shifting Point Diffraction Interferometry", *Proceeding SPIE*, 3048, 264–270 (1974).

FIG. 4 shows an SEM micrograph of the focus-aid enhanced mask used for this demonstration. The mask 40 includes test-beam window 41, reference-beam pinhole 42, and focus-aid pinhole 43. The reference pinhole was about 120 nm and the focus-aid was about 150 nm in diameter.

Referring to FIG. 2, the PS/PDI was initially operated without the beam splitter 28 so that there is only one beam (i.e., test-beam) generated that goes through the test-beam window 114. At this stage, conventional means were employed to accomplish an initial focus. For example, using the "knife edge" technique, the test-beam window edge can be used as the knife-edge and scanned across the focus of the optic under test. The intensity of radiation passing by the edge is monitored with the CCD. In this case, the test window 114 is translated across the test beam and a transition region is observed between maximum intensity (when the beam passes through the window) and minimum intensity (when the beam is completely blocked by the image-plane mask). The width of this transition region roughly gauges the quality of the focus, with a smaller transition region corresponding to a sharper focus. In practice, the width of the measured transition depends both on the size of the focused image point and on the quality of the knife-edge. Typically, several knife edge focus trials where the mask 120 is positioned at various positions in the z direction are required before achieving the sharpest transition between bright and dark across the edge (i.e., test-window edge).

Following this initial focus, the beam splitter 28 was positioned in the PS/PDI system thereby creating both the test-beam 110 and reference-beam 112. Accurate fine focus was accomplished interferometrically by measuring the defocus term using the focus-aid pinhole 123 as the PS/PDI mask 120 was moved through focus. In particular, focus was achieved by interferometrically measuring the wavefront, determining the Zernike defocus term, and adjusting the image-plane mask height position in order to minimize the Zernike defocus term and, hence, bring the system into the best possible focus. As is apparent, fine focus is facilitated by the larger diameter of pinhole 123 relative to that of pinhole 116. Once fine focus is achieved, mask 120 is translated so that the reference-beam is then focused into pinhole 116. The distance and direction of the separation between pinhole 123 and pinhole 116 is known.

FIG. 5A shows a representative interferogram and FIG. 5B shows its Fourier transform. The "decentered" test-beam is a result of the reference-beam being positioned on the focus-aid pinhole. The mask is designed such that the test beam is centered in the window when the reference beam is positioned on the true reference pinhole. Table 1 sets forth the focused-aid pinhole measured defocus in waves as a function of the PS/PDI mask displacement from the image plane.

TABLE 1

| Measured defocus (waves) | Displacement from image plane ($\mu$m) |
| --- | --- |
| 0.033 | 0.01 |
| 0.022 | 0.04 |
| −0.035 | −0.07 |
| −0.066 | −0.13 |

TABLE 1-continued

| Measured defocus (waves) | Displacement from image plane ($\mu$m) |
| --- | --- |
| −0.209 | −0.42 |
| −0.314 | −0.63 |
| NA* | −0.82 |

*NA = interferometric data was not analyzable.

As shown by the data, the 150 nm focus-aid pinhole is able to measure the defocus up to 0.63 $\mu$m. It should be noted that under these conditions a 120 nm reference pinhole can only measure defocus up to about 0.40 $\mu$m. For this case, the focus-aid pinhole has increased the capture range by about 30%. It is expected that capture range improvement increases as the reference pinhole gets smaller because the reference pinhole capture range will decrease while the focus-aid capture range remains fixed.

Sufficient pinhole separation is important in order to prevent spurious interference between the test beam and reference-beam flare passing through the focus-aid pinhole when performing the actual interferometric measurements. Test-window edge to test-beam separation is another important criterion when using the focus-aid pinhole because the test-beam size increases with defocus, making test-window edge interference a concern. This phenomenon has limited the capture range for the focus-aid pinhole measurements presented here. FIG. 6 shows the focus-aid interferogram just beyond the capture range. The high-contrast in the area where there are fringes is indicative of the window-edge effects limiting the capture range. Contrary to the focus-aid pinhole case, the capture range for the reference pinhole was limited by loss of contrast. Using a larger test-beam window would allow greater separation between the test-beam and the window edge in the focus mode and would further improve the utility of the focus-aid pinhole technique.

Because in the PS/PDI, there is no limitation on the length of the test-beam window in the direction orthogonal to the beam separation, it is possible to achieve any pinhole separation desired. For example, FIG. 7 shows mask 70 comprising test window 71, primary reference pinhole 72, and secondary reference pinhole 73. As is apparent, the test window has an elongated structure, and the pinhole separation is significantly increased.

Although it has been demonstrated that the focus-aid method with a pinhole size of 150 nm and a separation from the reference pinhole of 1.15 $\mu$m, the optimum parameters will vary as a function of the specific optical system being tested. For the case presented here, the optical system had an image-side numerical aperture of 0.08, an operational wavelength of 13.4 nm, and an rms wavefront error of about 2 nm.

As is appreciated by those skilled in the art, the electromagnetic radiation employed in the PS/PDI is not limited to soft X-rays (also referred to as extreme ultraviolet) since the radiation wavelength will depend on the particular application. Indeed, the wavelength can range, for instance, from about 5 nm to 2 $\mu$m. For EUV photolithography, the radiation employed typically has a short wavelength in the range of about 5 nm to 15 nm.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A method of focusing a phase-shifting point diffraction interferometer that defines an optical path that includes (i) a source of electromagnetic energy in the optical path, (ii) an optical element under test in the optical path, and (iii) an irradiance detector in the optical path downstream from the optical element under test, comprising the steps of:

(a) positioning a mask in the image plane of the optical system under test positioned upstream of the irradiance detector wherein the mask defines a test-beam window and at least one reference pinhole and a focus-aid pinhole having a diameter of at least about 20% larger than that of the at least one reference pinhole;

(b) directing a beam focused by the optical element under test through the test-beam window;

(c) rough-focusing the beam onto the image plane;

(d) positioning a beam divider in the optical path for dividing the electromagnetic radiation from the source into a test-beam and a reference-beam;

(e) aligning the mask so that the test-beam passes through the test-beam window and the reference-beam passes through the focus-aid pinhole;

(f) fine-focusing the beams on the image plane by detecting interference patterns with the irradiance detector and recovering the defocus term from the wavefront; and (g) maneuvering the mask so that the reference-beam passes through the reference-beam pinhole.

2. The method of claim 1 wherein the focus-aid pinhole has a diameter that ranges from about 1.2 to 2.5 times the diffraction-limited resolution of the optical system under test.

3. The method of claim 1 wherein the focus-aid pinhole has a diameter that ranges from about 12 nm to 250 $\mu$m.

4. The method of claim 1 wherein the at least one reference pinhole has a diameter that ranges from about 0.5 to 1 times the diffraction-limited resolution of the optical system under test.

5. The method of claim 1 wherein the at least one reference pinhole has a diameter that ranges from about 5 nm to 100 $\mu$m.

6. The method of claim 1 wherein the at least one reference pinhole is separated from the focus-aid pinhole by a distance that ranges from about 10 to 100 times the diffraction-limited resolution of the optical system under test.

7. The method of claim 1 wherein the at least one reference pinhole is separated from the focus-aid pinhole by a distance that ranges from about 0.1 $\mu$m to 10 mm.

8. The method of claim 1 wherein the test-beam window defines an opening with a width in the direction of beam separation that is about 20 to 100 times the diffraction-limited resolution of the optical system under test and a width in the direction orthogonal to the direction of the beam separation that is at least about 20 times the diffraction-limited resolution of the optical system under test.

9. The method of claim 1 wherein the test-beam window defines an opening with an area of about 0.04 $\mu m^2$ to 50 $cm^2$.

10. The method of claim 8 wherein the test-beam window defines a square-shaped opening.

11. The method of claim 8 wherein the test-beam window defines a rectangular-shaped opening.

12. The method of claim 1 wherein the electromagnetic radiation has a wavelength of about 5 nm to 2 $\mu$m.

13. The method of claim 1 wherein the beam divider is a diffraction grating.

14. The method of claim 13, wherein the diffraction grating is positioned between the source of the electromagnetic radiation and the optical element.

15. The method of claim 1 wherein the irradiance detector is a charged-coupled device.

16. A point diffraction interferometer system that defines an optical path, said system comprising:

(a) a source of electromagnetic energy in the optical path;

(b) a beam divider that can be positioned in the optical path for dividing electromagnetic radiation from the source into a reference-beam and a test-beam;

(c) an irradiance detector in the optical path downstream from the source of electromagnetic energy;

(d) a mask that is positioned in the image plane of an optical system under test which is positioned upstream of the irradiance detector wherein the mask defines a test-beam window and at least one reference-beam pinhole and a focus-aid pinhole having a diameter of at least about 20% larger than that of the at least one reference pinhole;

(e) means for directing a beam focused by the optical system under test through the test-beam window;

(f) means for rough-focusing the beam onto the image plane;

(g) means for positioning the beam divider in the optical path for dividing the electromagnetic radiation from the source into a reference-beam and a test-beam;

(h) means for aligning the mask so that the test-beam passes through the test-beam window and the reference-beam passes through the focus-aid pinhole, (i) means for fine-focusing the test and reference-beams on the image plane by detecting interference patterns with the irradiance detector, and (j) means for maneuvering mask so that the reference-beam passes through the reference pinhole.

17. The system of claim 16 wherein the focus-aid pinhole has a diameter that ranges from about 1.2 to 2.5 times the diffraction-limited resolution of the optical system under test.

18. The system of claim 16 wherein the focus-aid pinhole has a diameter that ranges from about 12 nm to 250 $\mu$m.

19. The system of claim 16 wherein the at least one reference pinhole has a diameter that ranges from about 0.5 to 1 times the diffraction-limited resolution of the optical system under test.

20. The system of claim 16 wherein the at least one reference pinhole has a diameter that ranges from about 5 nm to 100 $\mu$m.

21. The system of claim 16 wherein the at least one reference pinhole is separated from the focus-aid pinhole by a distance that ranges from about 10 to 100 times the diffraction-limited resolution of the optical system under test.

22. The system of claim 16 wherein the at least one reference pinhole is separated from the focus-aid pinhole by a distance that ranges from about 0.1 $\mu$m to 10 mm.

23. The system of claim 16 wherein the test-beam window defines an opening with a width in the direction of beam separation that is about 20 to 100 times the diffraction-limited resolution of the optical system under test and a width in the direction orthogonal to the direction of the beam separation that is at least about 20 times the diffraction-limited resolution of the optical system under test.

24. The system of claim 16 wherein the test-beam window defines an opening with an area of about 0.04 $micron^2$ to 50 $cm^2$.

25. The system of claim 23 wherein the test-beam window defines a square-shaped opening.

26. The system of claim 23 wherein the test-beam window defines a rectangular-shaped opening.

27. The system of claim 16 wherein the electromagnetic radiation has a wavelength of about 5 nm to 2 $\mu$m.

28. The system of claim 16 wherein the beam divider is a diffraction grating.

29. The system of claim 28 wherein the diffraction grating is positioned between the source of the electromagnetic radiation and the optical element.

30. The system of claim 16 wherein the irradiance detector is a charged-coupled device.

* * * * *